United States Patent
Lee et al.

(10) Patent No.: US 8,277,674 B2
(45) Date of Patent: Oct. 2, 2012

(54) METHOD OF REMOVING POST-ETCH RESIDUES

(75) Inventors: Chang-Hsiao Lee, Tainan County (TW); Yu-Tsung Lai, Tai-Chung Hsien (TW); Jiunn-Hsiung Liao, Tainan Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 302 days.

(21) Appl. No.: 12/637,762

(22) Filed: Dec. 15, 2009

(65) Prior Publication Data

US 2011/0139750 A1    Jun. 16, 2011

(51) Int. Cl.
*C23F 1/00* (2006.01)
(52) U.S. Cl. .............................. 216/67; 134/1
(58) Field of Classification Search .................. 134/1
See application file for complete search history.

(56) References Cited

U.S. PATENT DOCUMENTS

| | | | | |
|---|---|---|---|---|
| 5,401,358 | A | * | 3/1995 | Kadomura .................. 438/707 |
| 5,635,423 | A | * | 6/1997 | Huang et al. ................ 438/638 |
| 2003/0045124 | A1 | * | 3/2003 | Shih et al. ................... 438/763 |
| 2006/0042651 | A1 | | 3/2006 | Verhaverbeke |
| 2008/0083427 | A1 | * | 4/2008 | Block et al. .................. 134/3 |
| 2009/0298279 | A1 | * | 12/2009 | Feustel et al. ............... 438/618 |
| 2011/0053378 | A1 | * | 3/2011 | Baiocchi et al. ............. 438/706 |

OTHER PUBLICATIONS

Udel.edu, Metal and Semiconductor Wet Etching, udel.edu, Jan. 21, 2012, p. 1-11.*
Shakhashiri, General Chemistry, Jan. 21, 2012, scifun.org, p. 1-2.*
Broderick et al, Conductivity of Hydrofluoric Acid Solutions and the Effect of the Impurities, Sulfurous and Hydrofluosilicic Acids, Jan. 1962, Journal of chemical and engineering data, vol. 7, No. 1, p. 55-57.*
Thanu et al, Post Plasma Etch Residue Removal in Dilute HF Solutions, Jun. 2011, Journal of the electrochemical society, vol. 158, issue 8, semiconductor devices, materials, and processing, Abstract.*

\* cited by examiner

*Primary Examiner* — Binh X Tran
*Assistant Examiner* — David Cathey, Jr.
(74) *Attorney, Agent, or Firm* — Winston Hsu; Scott Margo

(57) ABSTRACT

A method of removing post-etch residues is provided. First, a substrate is provided. An isolation layer covers the substrate and a conductive layer is embedded in the isolation layer. A dielectric layer and a hard mask cover the isolation layer. Then, an etching process is performed, and a patterned hard mask is formed by etching the hard mask by ions or atoms. After that, a charge-removing process is performed by using a conductive solution to cleaning the patterned hard mask and the dielectric layer so as to remove the charges accumulated on the patterned hard mask and the dielectric layer during the etch process. Finally, the post-etch residues on the patterned hard mask and the dielectric layer is removed.

11 Claims, 2 Drawing Sheets

METHOD OF REMOVING POST-ETCH RESIDUES

BACKGROUND OF THE INVENTION

1. Field of the Invention

The present invention relates to a method of removing post-etch residues, and more particularly to a method of removing post-etch residues without causing arcs.

2. Description of the Prior Art

Damascene interconnect processes incorporated with copper are known in the art, which are also referred to as "copper damascene processes" in the semiconductor industry. Generally, the copper damascene processes are categorized into single damascene process and dual damascene process. Because the dual damascene has advantages of simplified processes, lower contact resistance between wires and plugs, and improved reliance, it is widely applied in damascene interconnect technique. In addition, to reducing resistance and parasitic capacitance of the multi-level interconnect and improving speed of signal transmission, the dual damascene interconnect in state-of-the-art is fabricated by filling trench or via patterns located in dielectric layer which comprise low-K material with copper and performing a planarization process to obtain a metal interconnect. According to the patterns located in the dielectric layer, the dual damascene process is categorized into trench-first process, via-first process, partial-via-first process, and self-aligned process.

However, when a via or a trench is formed by etching the dielectric layer, lots of charges are accumulated on the dielectric layer. Therefore, when the post-etch residues on the dielectric layer is removed by a cleaning solution, arcs may form when the cleaning solution contacts the surface of the dielectric layer with lots of charges. Then, semiconductive elements below or on the dielectric layer will be cracked because of the arcs.

SUMMARY OF THE INVENTION

In light of above, the present invention provides a novel method of removing post-etch residues to solve the above-mentioned problems.

According to a preferred embodiment of the present invention, a method of removing post-etch residues, includes: first, a substrate covered by an isolation layer is provided, a conductive layer is embedded in the isolation layer and a dielectric layer and a hard mask is positioned on the isolation layer and the conductive layer. Then, an etching process is performed to etch the hard mask with ions so as to form a patterned hard mask and exposes part of the dielectric layer. After that, the patterned hard mask and the dielectric layer are rinsed with a solution containing conductive ions to remove the ions accumulated on the patterned hard mask and the dielectric layer. Finally, a post-etch residue on the patterned hard mask and the dielectric layer is removed.

The solution includes deionized water and conductive ions such as bicarbonate ions, carbonate ions ($CO_3^{2-}$) and ammonium ions ($NH_4^+$). The resistance of the solution is preferably between 1 KΩ-cm to 3000 KΩ-cm.

The solution conducts the accumulated charges to leave the patterned hard mask and the dielectric layer. Therefore, when cleaning the post-etch residues on the patterned hard mask and the dielectric layer, the cleaning solution can contact the surface of the patterned hard mask and the dielectric layer without causing arcs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
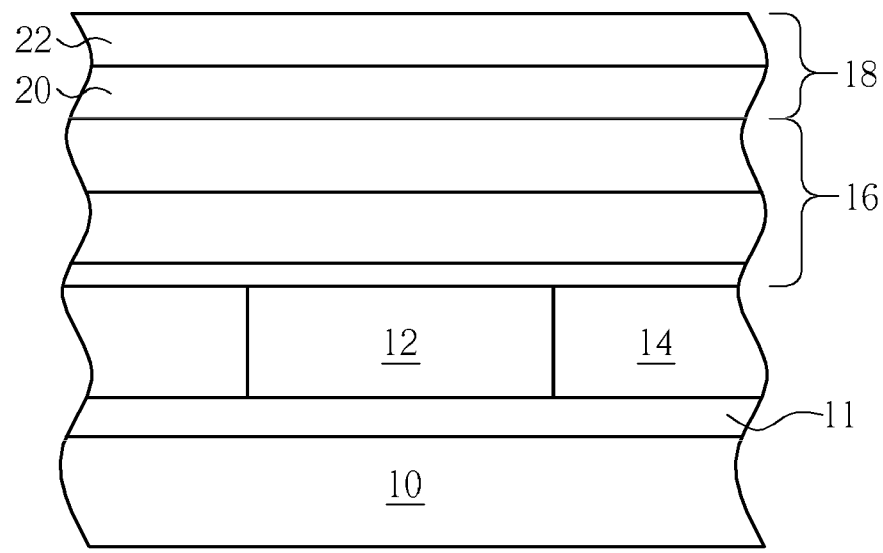
FIG. 1 to FIG. 4 depict a method of removing post-etch residues of the present invention schematically.

FIG. 1 to FIG. 4 depict a method of removing post-etch residues of the present invention schematically. The method provided in the present invention is particularly suitable for single damascene or dual damascene. As shown in FIG. 1, a substrate 10 covered by a dielectric layer 11 is provided. The dielectric layer 11 is covered by an isolation layer 14, and a conductive layer 12 such as copper, aluminum or other conductive materials is embedded in the isolation layer 14. A dielectric layer 16 and a hard mask 18 are positioned in sequence on the isolation layer 14 and the conductive layer 12. The dielectric layer 16 may be a multilayer structure includes silicon nitride, silicon oxide or other dielectric materials. The hard mask 18 can also be a multilayer structure. For example, the hard mask 18 may includes a titanium nitride layer 20 and a silicon oxide layer 22.

Figure 2:
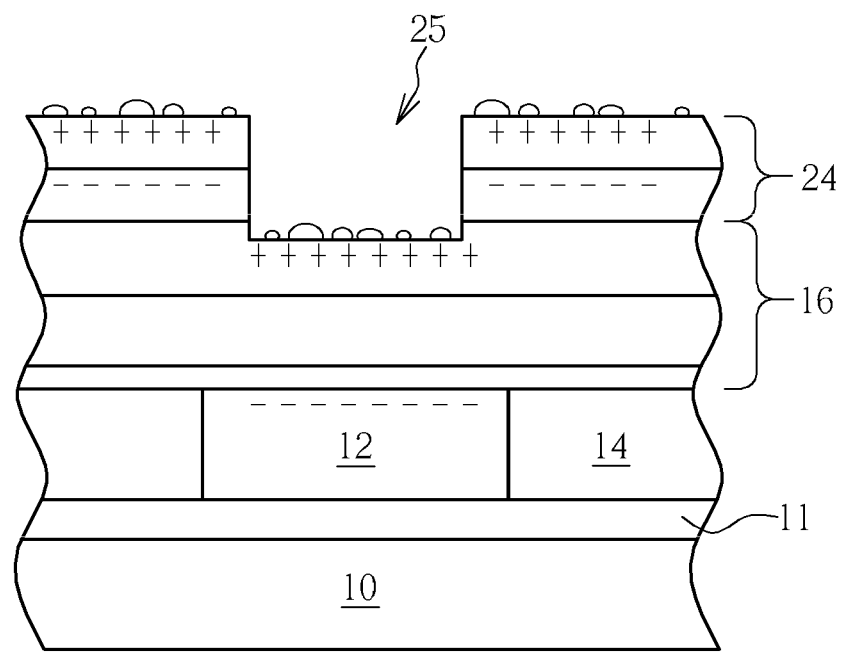

After that, as shown in FIG. 2, a patterned photoresist (not shown) is formed to cover part of the hard mask 18. Later, by taking the dielectric layer 16 as an etching stop layer, an etching process is performed to etch the hard mask 18 to form a patterned hard mask 24. The etching process may be a plasma etching, a reactive ion etching or other process utilizing ions, atom, radicals to etch. The patterned hard mask 24 includes an opening 25. The opening 25 may be a via or a trench of a dual damascene structure. Because the hard mask 18 and the dielectric layer 16 are etched by ions during the etching process, a lot of charges will accumulate on the patterned hard mask 24 and the dielectric layer 16 after the etching process.

Figure 3:
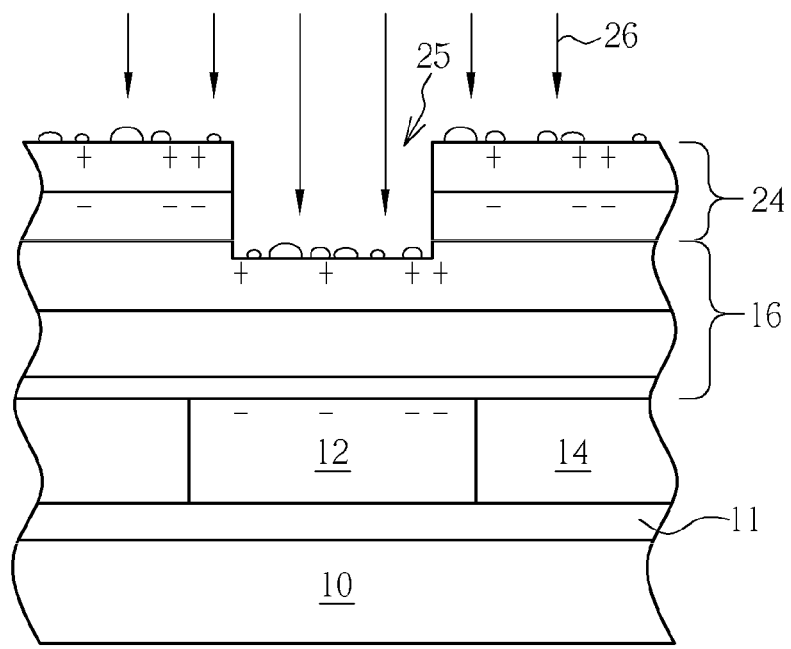

Later, as shown in FIG. 3, a charge removing process is performed to remove charges on the patterned hard mask 24 and the dielectric layer 16. The charge removing process is performed by using a conductive solution 26 to rinse the patterned hard mask 24 and the dielectric layer 16, and most of the charges on the patterned hard mask 24 and the dielectric layer 16 will be conducted away by the conductive solution 26. In the present embodiment, the conductive solution 26 can comprise deionized water and conductive ions. The conductive ions can be bicarbonate ions, carbonate ions or ammonium ions. The resistance of the conductive solution 26 is preferably between 1 KΩ-cm to 3000 KΩ-cm and the PH value of the conductive solution 26 is advantageously 3. The conductive solution 26 can by form by mixing gaseous carbon dioxide with deionized water until the carbon dioxide reach a saturated concentration under the normal pressure and the normal temperature. In other words, the conductive solution is a saturated solution of the conductive ions in the room temperature. Besides, the charge removing process can also be performed by using gas mixing ions (charged gas). For example, an ionizing blower can be used to form charged gas, and the charged gas can neutralize the charges on the patterned hard mask 24 and the dielectric layer 16.

Figure 4:
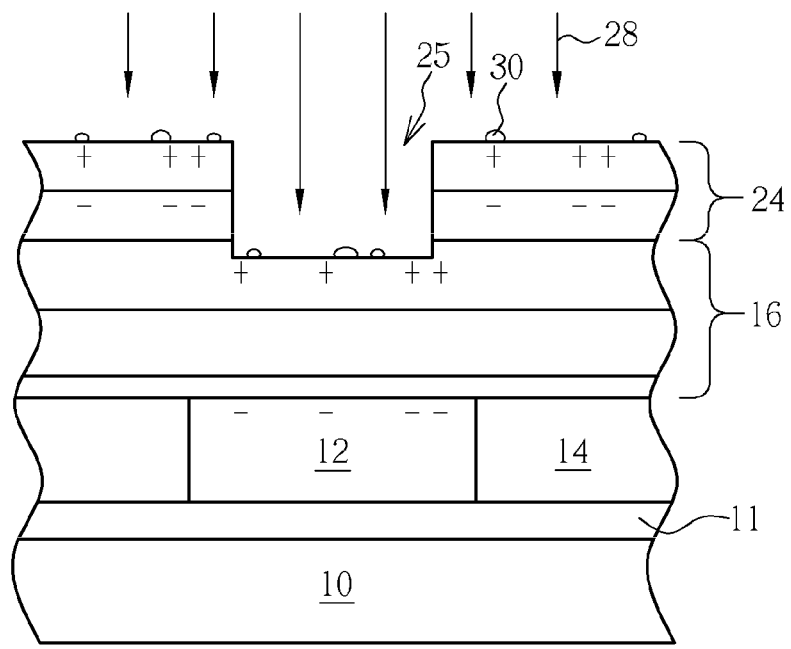

Finally, as shown in FIG. 4, a cleaning process is performed to remove post-etch residues. Generally, a cleaning solution 28 containing water more than 80% is used to remove the post-etch residues 30 on the surface of the patterned hard mask 24 and the dielectric layer 16. For example, the dilute hydrofluoric acid can be the cleaning solution 28 in this embodiment. The resistance of the cleaning solution 28 is usually higher than that of the conductive solution 26. Therefore, the cleaning solution 28 is seen as a non-conductive solution. Furthermore, the cleaning solution 28 contains reactive ions which reacts with the post-etch residues 30. Therefore, the post-etch residues 30 can not only be removed by the cleaning solution 28 in a physical method, but also can be removed by chemical reaction. Unlike the cleaning solution 28, the conductive solution 26 does not have reactive ions reacting with the post-etch residues 30. The ions in the conductive solution 26 are only for conductivity.

Moreover, the aforesaid conductive ions can be added into the cleaning solution 28 to decrease the resistance of the cleaning solution and to make the cleaning solution 28 become conductive. In this way, the conductive solution 26 can be replaced by the cleaning solution 28. By using the cleaning solution 28 with the added conductive ions, the charges on the patterned hard mask 24 and the dielectric layer 16 can be conducted away by the cleaning solution 28, and in the same time the post-residues 30 can be removed by the cleaning solution 28. That is, the charge removing process and the cleaning process can both be performed by using the cleaning solution 28 simultaneously.

Besides, as the conductive ions are added into the cleaning solution 28 and make the cleaning solution 28 conductive, the conductive solution 26 can still be used to rinse the patterned hard mask 24 and the dielectric layer 16 before the cleaning solution 28 is used. That is, the conductive solution 26 rinses the patterned hard mask 24 and the dielectric layer 16 to remove most of the charges first. Then, the cleaning solution 28 with added conductive ions can be used to remove the post-etch residues 30 and conduct the remaining charges on the patterned hard mask 24 and the dielectric layer 16 simultaneously.

After the charge removing process and the cleaning process are completed, the dielectric layer 16 can be etched to form a trench or a via by taking the patterned hard mask 24 as a mask. Later, another patterned mask can be use to cover the dielectric layer 16 and to form a via corresponding to the aforesaid trench or a trench corresponding to the aforesaid via.

Although the above mentioned process takes copper damascene processes as example, but is not limited to it. The present invention can be applied to other processes, such as contact plug formation, or other dielectric layer etching process.

In the conventional process, the hard mask is usually etched by a plasma etching and a reactive ion. Because the patterned hard mask and the dielectric layer are both non-conductive materials, a lot of charges may accumulate on the patterned hard mask and the dielectric layer after etching. If the cleaning solution having high resistance rinses the patterned hard mask and the dielectric layer immediately after etching, serious arcs will happen when the cleaning solution contacts the surface of the patterned hard mask and the dielectric layer. Then, elements on or below the dielectric layer will crack due to the arc. The present invention features using a conductive solution to rinse the patterned hard mask and the dielectric layer and conduct the charges away or neutralize the charges before the cleaning solution is used. As a result, the arcs can be prevented.

Those skilled in the art will readily observe that numerous modifications and alterations of the device and method may be made while retaining the teachings of the invention.

What is claimed is:

1. A method of removing post-etch residues, comprising:
providing a substrate covered by a isolation layer, a conductive layer embedded in the isolation layer and a dielectric layer and a hard mask positioned on the isolation layer and the conductive layer;
performing an plasma etching process to etch the hard mask with ions so as to form a patterned hard mask and exposes part of the dielectric layer;
rinsing the patterned hard mask and the dielectric layer with a solution containing conductive ions to remove charges accumulated on the patterned hard mask and the dielectric layer; and
performing a remove process to remove a post-etch residue on the patterned hard mask and the dielectric layer after removing the charges accumulated on the patterned hard mask and the dielectric layer, wherein the post-etch residue does not react with the conductive ions.

2. The method of removing post-etch residues of claim 1, wherein the solution comprises deionized water.

3. The method of removing post-etch residues of claim 2, wherein the conductive ions are selected from the group consisting of bicarbonate ions, (HCO3-), carbonate ions ($CO_3^{2-}$) and ammonium ions (NH4+).

4. The method of removing post-etch residues of claim 2, wherein the solution is a saturated solution of the conductive ions.

5. The method of removing post-etch residues of claim 1, wherein the resistance of the solution is between 1 KΩ-cm to 3000 KΩ-cm.

6. The method of removing post-etch residues of claim 1, wherein the pH value of the solution is substantially 3.

7. The method of removing post-etch residues of claim 1, wherein the solution contains water more than 80%.

8. The method of removing post-etch residues of claim 1, wherein the patterned hard mask comprises a via of a dual damascene structure.

9. The method of removing post-etch residues of claim 1, wherein the patterned hard mask comprises a trench of a dual damascene structure.

10. The method of removing post-etch residues of claim 1, wherein the conductive layer comprises copper.

11. A method of removing post-etch residues, comprising:
providing a substrate covered by a isolation layer, a conductive layer embedded in the isolation layer and a dielectric layer and a hard mask positioned on the isolation layer and the conductive layer, wherein the hard mask comprises TiN;
performing an plasma etching process to etch the hard mask with ions so as to form a patterned hard mask and exposes part of the dielectric layer;
rinsing the patterned hard mask and the dielectric layer with a solution containing conductive ions to remove charges accumulated on the patterned hard mask and the dielectric layer; and
performing a remove process to remove a post-etch residue on the patterned hard mask and the dielectric layer after removing the charges accumulated on the patterned hard mask and the dielectric layer, wherein the post-etch residue does not react with the conductive ions.

* * * * *